United States Patent [19]

Yano

[11] 3,729,732

[45] Apr. 24, 1973

[54] CASCADE-FEEDBACK ANALOG TO DIGITAL ENCODER WITH ERROR CORRECTION

[75] Inventor: Kaoru Yano, Minato-ku, Tokyo, Japan

[73] Assignee: Nippon Electric Company Limited, Tokyo, Japan

[22] Filed: July 27, 1971

[21] Appl. No.: 166,639

[30] Foreign Application Priority Data

Jan. 29, 1971 Japan ..................................46/3398

[52] U.S. Cl. ..............................................340/347 AD
[51] Int. Cl. ..............................................H03k 13/02
[58] Field of Search ................................340/347 AD; 324/99 D

[56] References Cited

UNITED STATES PATENTS

| | | | |
|---|---|---|---|
| 3,641,562 | 2/1972 | Kobayashi et al. | 340/347 AD |
| 3,638,218 | 1/1972 | Kaneko et al. | 340/347 AD |
| 3,614,777 | 10/1971 | Foerster | 340/347 AD |
| 3,599,204 | 8/1971 | Severin | 340/347 AD |
| 3,577,138 | 5/1971 | Kawashima et al. | 340/347 AD |
| 3,460,131 | 8/1969 | Gorbatenko et al. | 340/347 AD |
| 3,259,896 | 7/1966 | Pan | 340/347 AD |
| 3,241,100 | 3/1966 | Loofbourrow | 340/347 AD X |

*Primary Examiner*—Charles D. Miller
*Attorney*—Louis E. Marn et al.

[57] ABSTRACT

A coder for converting an input analog signal into a digital output signal containing first, second and other bit signals, includes a first coding circuit activated by the input analog signal to generate the output of the first coding circuit, a second coding circuit activated by the first bit signal to generate the second bit signal judged at a first time point, a feedback coding circuit energized by the output of the second coding circuit to generate the other bit signals; the first, second and other bit signal constituting the digital signal at an output terminal; the second and other bit signals subject to error due to the level of the output of the second coding circuit at the first time point; and a bit level comparison circuit comparing the second bit signal judged at the first time point and at a second time point succeeding the first time point for producing a comparison signal to correct the second and other bit signals, whereby the first bit signal and the corrected second and other bit signals after the second time point are included in the digital signal at the output terminal.

3 Claims, 9 Drawing Figures

INVENTOR.
Kaoru Yano
BY
Marn & Jangarathis
ATTORNEYS

Patented April 24, 1973 3,729,732

7 Sheets-Sheet 2

INVENTOR.
Kaoru Yano
BY
Marn & Jangarathis
ATTORNEYS

| Input Analog Signal | Output of 1st Bit Encoder | Input of 2nd Bit Ampl. | Output of 2nd Bit Ampl. | Output of 2nd Bit Encoder | PCM Output Signal |
|---|---|---|---|---|---|
| 1 | -1 | $-\frac{24}{30}$ | $\frac{6}{30}$ | $\frac{6}{30}$ | 1000 |
| $\frac{22}{30}$ | $-\frac{22}{30}$ | $-\frac{16}{30}$ | $\frac{4}{30}$ | $\frac{4}{30}$ | 1001 |
| $\frac{14}{30}$ | $-\frac{14}{30}$ | $-\frac{8}{30}$ | $\frac{2}{30}$ | $\frac{2}{30}$ | 1010 |
| $\frac{10}{30}$ | $-\frac{10}{30}$ | $-\frac{4}{30}$ | $\frac{1}{30}$ | $\frac{1}{30}$ | 1011 |
| $\frac{6}{30}$ | $-\frac{6}{30}$ | 0 | 0 | 0 $\frac{6}{30}$ | 1100 |
| $\frac{4}{30}$ | $-\frac{4}{30}$ | $\frac{2}{30}$ | $-\frac{2}{30}$ | $\frac{4}{30}$ | 1101 |
| $\frac{2}{30}$ | $-\frac{2}{30}$ | $\frac{4}{30}$ | $-\frac{4}{30}$ | $\frac{2}{30}$ | 1110 |
| $\frac{1}{30}$ | $-\frac{1}{30}$ | $\frac{5}{30}$ | $-\frac{5}{30}$ | $\frac{1}{30}$ | 1111 |
| 0 | 0 | $\frac{6}{30}$ | $-\frac{6}{30}$ | 0 | 0111 |
| $-\frac{1}{30}$ | $-\frac{1}{30}$ | $\frac{5}{30}$ | $-\frac{5}{30}$ | $\frac{1}{30}$ | 0110 |
| $-\frac{2}{30}$ | $-\frac{2}{30}$ | $\frac{4}{30}$ | $-\frac{4}{30}$ | $\frac{2}{30}$ | 0101 |
| $-\frac{4}{30}$ | $-\frac{4}{30}$ | $\frac{2}{30}$ | $-\frac{2}{30}$ | $\frac{4}{30}$ | 0100 |
| $-\frac{6}{30}$ | $-\frac{6}{30}$ | 0 | 0 | $\frac{6}{30}$ 0 | 0011 |
| $-\frac{10}{30}$ | $-\frac{10}{30}$ | $-\frac{4}{30}$ | $\frac{1}{30}$ | $\frac{1}{30}$ | 0010 |
| $-\frac{14}{30}$ | $-\frac{14}{30}$ | $-\frac{8}{30}$ | $\frac{2}{30}$ | $\frac{2}{30}$ | 0001 |
| $-\frac{22}{30}$ | $-\frac{22}{30}$ | $-\frac{16}{30}$ | $\frac{4}{30}$ | $\frac{4}{30}$ | 0000 |
| -1 | -1 | $-\frac{24}{30}$ | $\frac{6}{30}$ | $\frac{6}{30}$ | |

Fig. 3.

*INVENTOR.*
Kaoru Yano
*BY*
Marn & Jangarathis
*ATTORNEYS*

INVENTOR.
Kaoru Yano
BY
Marn & Jangarathis
ATTORNEYS

INVENTOR.
Kaoru Yano
BY
Marn & Jangarathis
ATTORNEYS

INVENTOR.
Kaoru Yano
BY
Marn & Jangarathis
ATTORNEYS

INVENTOR.
Kaoru Yano
BY
Marn & Jangarathis
ATTORNEYS

CASCADE-FEEDBACK ANALOG TO DIGITAL ENCODER WITH ERROR CORRECTION

This invention relates to a coding apparatus for PCM communication systems and more specifically to a high-speed nonlinear coding apparatus.

Analogue-to-digital conversion is needed for PCM communication systems, and various systems are proposed on the non-linear coding systems utilized for the coding of speech signals transmitted on the telephone signal transmission lines. Recently, non-linear codes have been adopted (wherein the weight of each bit is not uniform) which enable conversion into a linear code (usual binary code) through digital processes. This particular type of coding is aimed at realizing such new service as conferencing by direct digital processing for coded signals. From the practical point of view, the companding characteristics of 13 segments and of 15 segments are especially important in the companding characteristics realized by the use of non-linear codes convertible directly into linear codes by digital processes. Those encoders which realize such segment companding characteristics are generally referred to as segment coders.

The most fundamental form of the segment coders consists of a combination of a linear coder and a code converter, wherein analogue signals are first converted into linear codes and then into non-linear codes. This method is, however, not practical, because a linear coder of high speed and high accuracy and a code converter with complex circuits are needed. Although the segment companding characteristics can be realized by utilization of non-linear feedback type coders or cascade type coders, they are usually accompanied by some difficulties. A combined coder of these two coders in their characteristics is also proposed, wherein a non-linear coder is realized in such a manner that the first and second bits may be encoded through a cascade type coding circuit and the third and succeeding bits may be encoded through a feedback type coding circuit. The coder is generally composed of a small number of operational amplifiers and high accuracy resistors, a simple weighting circuit and logic circuits, and comparison circuits of low sensitivity. The coding system, however, is impractical also, when a high operation speed is needed for a more-than-100 channel telephone signals to be encoded. This is due to the impracticably large bandwidth of the operational amplifiers to be used.

Therefore, the object of this invention is to provide an improved high-speed non-linear coding apparatus designed for solving the difficulties mentioned above, using a realizable operational amplifier of comparably narrow band-width.

In this invention, the coding of first and second bits of each codeword is performed in the cascade-type-coding fashion, while that for a third and a few succeeding bits is performed in the feedback-type-coding fashion. Particularly, this invention is characterized in that the second bit is read out again upon completion of the encoding of the second, the third and the few succeeding bits and compared in its sign with the same second bit observed immediately after the coding. The above-mentioned second, third and few succeeding bits are corrected in response to the result of the comparison. The correction is possible due to the fact that the mis-judgement in the first time determination of the sign of the second bit is caused only when the input signal exceeds the second bit decision level and then gradually comes to take a value close to the level.

A detailed explanation is now given by referring to the attached drawings, wherein:

FIG. 3 is a table showing the relationship between input and output signals observed in the apparatus of FIG. 1;

Figure 1:
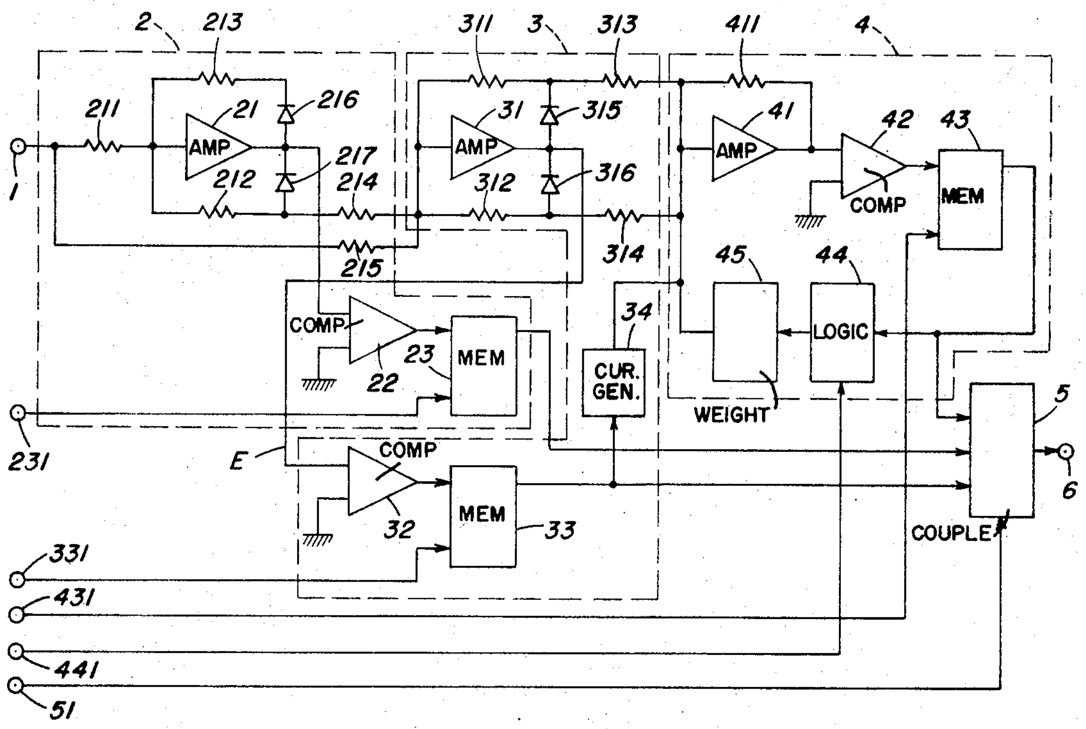
FIG. 1 shows a block diagram of an example of a conventional segment type non-linear coding apparatus.

Now referring to FIG. 1, an analogue input signal or time division multiplexed pulse amplitude modulated (PAM) input signal is fed to a first bit coding circuit 2 through an input terminal 1. The first bit coding circuit 2 comprises an amplifier 21, resistors 211, 212, 213, 214 and 215, diodes 216 and 217, a comparator 22 and a memory circuit 23 such as a D-flip-flop. The input analogue signal is rectified to supply the rectified analogue signal to a second bit coding circuit 3. At the same time the result of the first bit sign determination is written into the memory circuit 23 by the first bit decision pulses supplied to a terminal 231. The second bit coding circuit 3 composed of an operational amplifier 31, resistors 311, 312, 313 and 314, diodes 315 and 316, a comparator 32, a memory circuit 33 such as a D-flip-flop and a current generator 34 supplies non-linearly amplified input signals to a feedback coding circuit 4, while the result of the sign determination for the second bit is written into the memory circuit 33 in response to the second bit decision pulses applied to a terminal 331. The feedback coding circuit 4 comprises an amplifier 41, a resistor 411, a comparator 42, a memory circuit 43, a logic circuit 44 and a weighting circuit 45. The output signal from the comparator 42 is written into and memorized by the memory circuit 43 in response to decision pulses supplied to a terminal 431, and the output thereof is supplied to the logic circuit 44. The logic circuit 44 supplies to the weighting circuit 45 signals indicating decision levels for each of the sequential bits utilizing output signals of the memory circuit 43 and control pulses applied to a terminal 441. The output signal of the weighting circuit 45 is supplied to the comparator 42 after being added to the input signal by the amplifier 41. The output digital signals from each of the coding circuits 2, 3 and 4 are supplied to a coupling circuit 5 to be coupled by the control signal supplied to the terminal 51, the output signals of the coupling circuit being applied to an output terminal 6.

Figure 2:
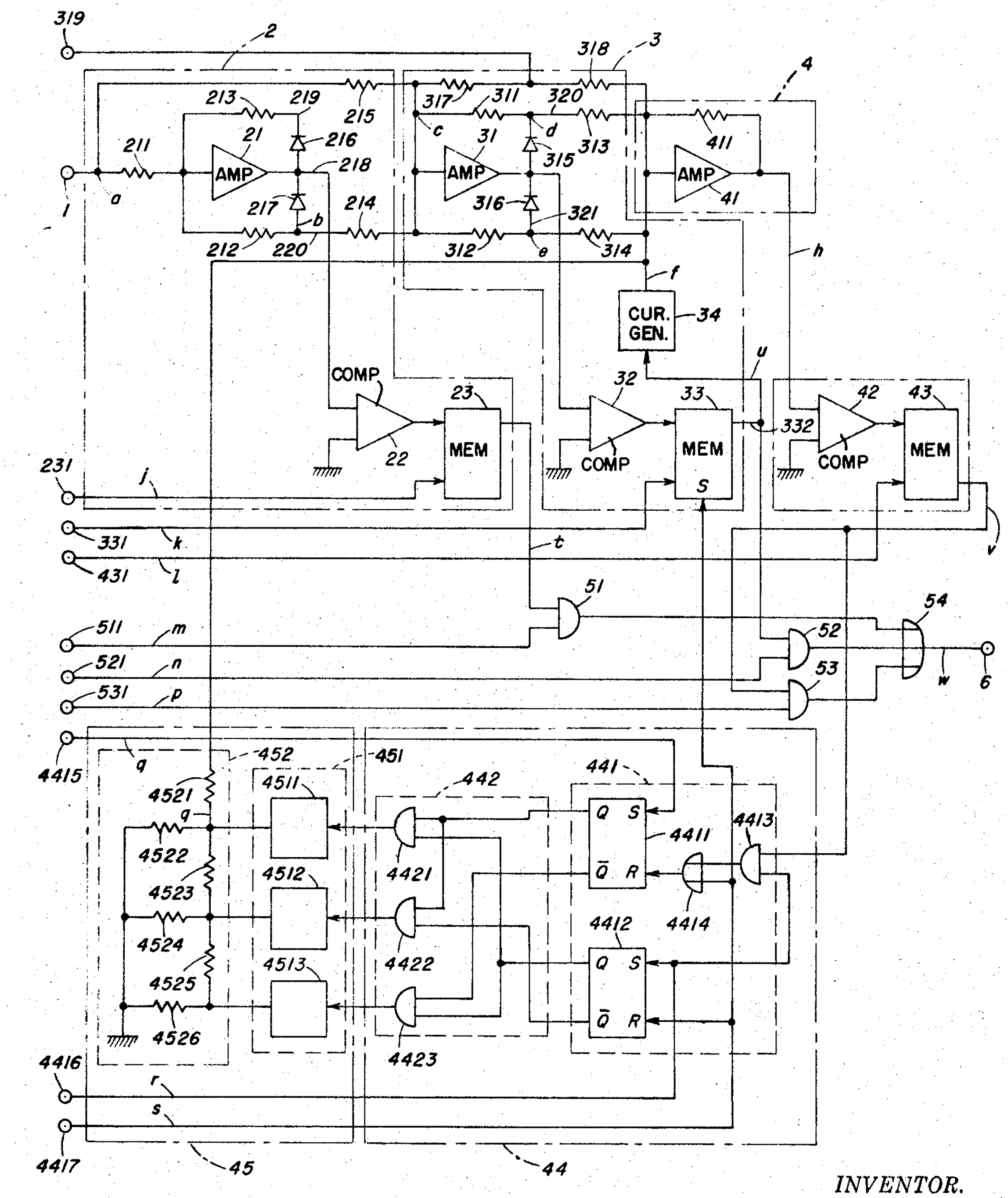
FIG. 2 is a detailed circuit diagram of the apparatus of FIG. 1.

Referring to FIG. 2, more detailed explanation is now given on the construction and operation of the coder shown in FIG. 1. The coder shown here is assumed to be for 5-bit codewords. This is only for a simplification of the explanation. It is apparent that 7- or 8-bit coders may also be designed on the same principle.

FIG. 3 illustrates the operation of this coding system. It shows relationship between input analogue signal, output signal from the first bit coding circuit, input signals to the second bit amplifier, output signals from the second bit amplifier, output signals from the second bit coding circuit, and PCM output signals.

When the polarity or sign of the input signal voltage to the analogue input terminal 1 of FIG. 2 is positive, the voltage at an output connection 218 becomes negative, with a diode 216 being cut off and feedback current circulating through a resistor 212 as the result of conduction of a diode 217. A negative voltage then appears at an output connection 220, and the voltage at an output connection 219 becomes zero. When the input voltage is negative on the contrary, the voltage at the output connection 220 becomes zero and positive voltage appears at the output terminal 219. The output signal from the first bit coding circuit 2 is the sum of currents which flow through resistors 214 and 215. As the current flowing through the resistors 214 and 215 is negative and positive, respectively, when the input signal has positive polarity, the sum of both currents is negative and its absolute value is equal to the absolute value of the current flowing through a resistor 215, if resistors 211, 212, 213 and 214 are so selected that the absolute value of former current may be twice as large as the latter. When the input signal has negative polarity, the output current of the first bit coding circuit arises only from the current flowing through the resistor 215 as the current which flowing through the resistor 214 becomes zero in this case. In other words, the output current of the first bit coding circuit is negative regardless of polarity of the input signal, and relates only to the absolute value of the input signal as is shown by the first and second columns of FIG. 3.

The operation of the second bit coding circuit is now explained referring to FIG. 3. If the given input signal is +3/30 for instance, the PCM output (see sixth line) is 1101 because the input signal lies between +4/30 and +2/30 as is shown by quantization decision levels in the first column of FIG. 3. The second column shows the output of the first bit coding circuit 2 and is comprised of the rectified output of the signal shown by the first column. The third column shows the biased value by +6/30 to the signal of the second column. It will be easily understood that ±6/30 corresponds to the decision level of the second bit by referring to the first and sixth lines. The bias current to realize +6/30 is supplied through a resistor 317 by a positive supply voltage connected to a terminal 319 of FIG. 2. The resistors 311, 312, 313 and 314 are so selected that the relation between input and output signals of the second bit amplifier may be expressed by the third and fourth columns of FIG. 3. If the input signal to the second bit amplifier is positive, the output from the comparator 32 is positive also and the information is written into the memory circuit 33 as the second bit information being triggered by trigger signal applied to the terminal 331. The current generator circuit 34 driven by the output of the circuit 33 generates a current signal corresponding to −6/30, only when the second bit is 0. The current signal representing +6/30 is also introduced through a resistor 318, resulting in the addition of +6/30 current to the output signal of the second bit amplifier circuit when the second bit is 1 (shown by the fifth line of FIG. 3.).

It is soon observed by referring to the fifth and sixth columns of FIG. 3 that a constant relation is present between the PCM output and the second bit coding circuit signals. Namely the 3rd bit and the 4th bit of PCM output take the form 11rd only when the output of the second bit coding circuit lies between 0 and 1/30, 01 corresponds to the range between 2/30 and 4/30, and 00 represents the range between 4/30 and 6/30. Coding of the third bit and the fourth bit is performed through feedback coding mode.

The circuit effecting the feedback coding comprises the amplifier 41, the resistor 411, the comparator 42, the memory circuit 43, a memory circuit 441, a matrix circuit 442, a weighting resistor driving circuit 451 and a weighting resistor network 452. The memory circuit 441 consists of flip-flops 4411 and 4412, an AND gate 4413 and an OR gate 4414. The matrix circuit 442 consists of AND gates 4421 to 4423. The weighting resistor driving circuit 451 consists of current generators 4511 to 4513. The weighting resistor network 452 comprises resistors 4521 to 4526.

Figure 5:
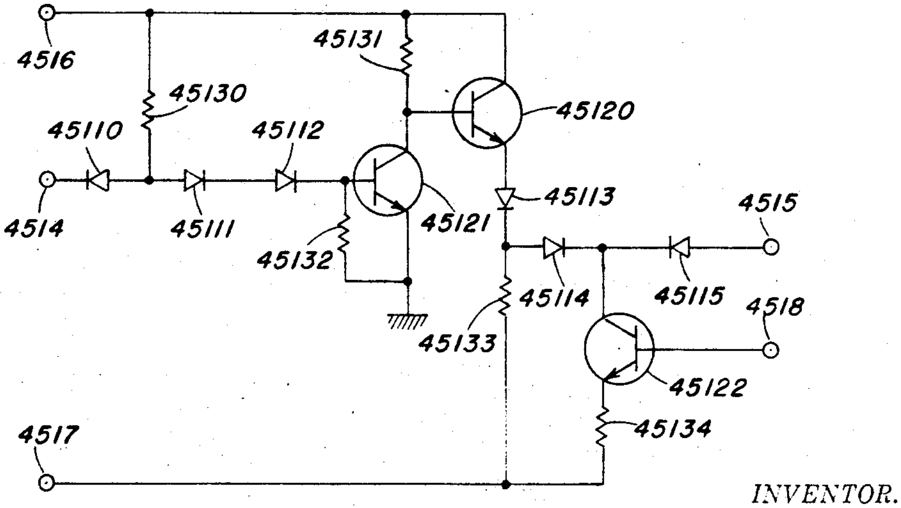
FIG. 5 shows an example of a current generation circuit.

FIG. 5 shows an example of the current generator circuits 34 and 4511 to 4513, wherein terminals 4514 and 4515 are input and output terminals, respectively. In this circuit, a positive power supply (+5V) is connected to a terminal 4516, a negative power supply (−10V) to a terminal 4517 and a reference voltage to a terminal 4518. A driving circuit for switching diodes 45114 and 45115 is comprised of diodes 45110 to 45113, transistors 45120 and 45121 and resistors 45130 to 45133. A transistor 45122 and a resistor 45134 are for a constant current source. If a 0 state (about 0V) is applied to the input terminal 4514, the diode 45115 is driven to cutoff state and no output current is drawn because the collector current of the transistor 45122 drives a diode 45114. If 1 state (about +5V) is applied to the input terminal 4514 on the contrary, the diode 45114 is driven into a cutoff state because the collector current of the transistor 45122 flows through a diode 45115 from the output terminal 4515. Since the collector current of the transistor 45122 is kept constant, this circuit is utilized as the current generator with the operation modes mentioned above.

The feedback coding circuit converts input level between 0 and 1/30 to 11, between 1/30 and 2/30 to 10, between 2/30 and 4/30 to 01 and between 4/30 and 6/30 to 00.

Figure 4:
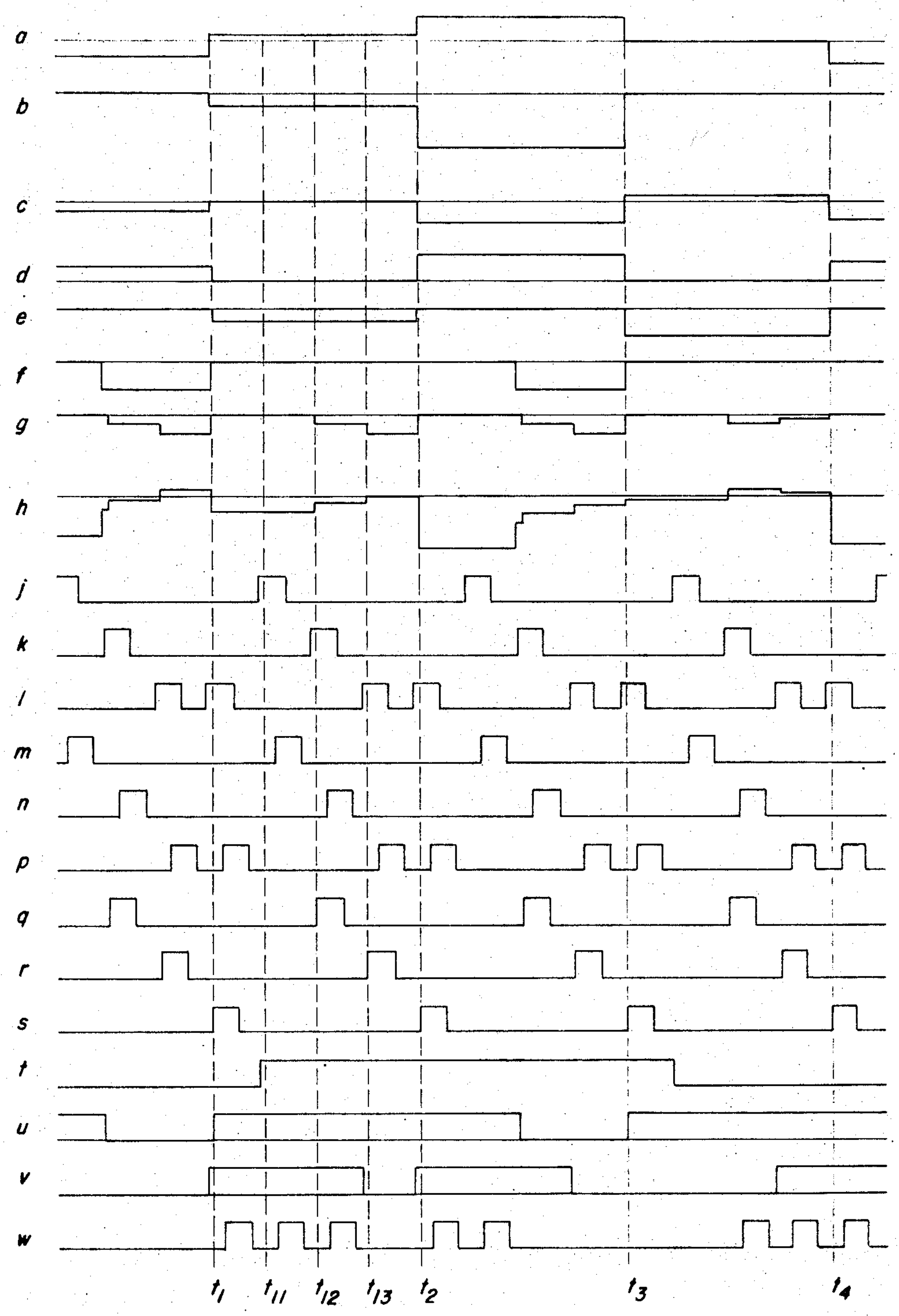
FIG. 4 shows waveforms observed at various points in the apparatus of FIG. 1.

The operation of the coder is explained referring to a time chart shown in FIG. 4, wherein waveforms denoted by *a* to *w* (which are denoted by 4-*a* to *w* for simplicity) correspond to the waveforms at the respective leads in FIG. 2 under the corresponding characters. The voltage of input PAM signal (4-*a*) applied to the input terminal 1 varies at the time points $t_1$, $t_2$, $t_3$ . . . . The voltage waveform at the output connection 220 of the first bit coding circuit is denoted by (4-*b*), the amplitude thereof being twice as large as the value for the case where the input signal (4-*a*) is positive-going. The input current to the second bit coding circuit is the sum of respective currents which flow in through resistors 214, 215 and 317, the waveform of said input current being shown as (4-*c*). The waveform (4-*d*) shows the voltage at the output connection 320 of the second bit coding circuit 3, the positive voltage thereof appearing only when the input current (4-*c*) is negative. The waveform (4-*e*) shows the voltage at the output connection 321 of the second bit coding circuit 3 on the other hand, the negative voltage thereof appearing only when the input current (4-*c*) is positive. The output of the comparator 22 is written in by trigger pulses (4-*j*) applied to the terminal 231 into the memory circuit 23 whose output is shown by (4-*t*). Similarly, the output of the comparator 32 is written in by the trigger pulses (4-*k*) applied to the terminal 331 into the memory circuit 33 whose output is shown by (4-*u*). The waveform (4-*f*) shows the current signal supplied to the amplifier 41 by the current generator circuit 34, said current signal flowing only when the input signal thereof or the signal (4-*u*) at the output connection 332 of memory circuit 33 is in 0 condition. On the other hand, the weighting resistor circuit 452 generates the output signal as shown in (4-*g*), wherein the third bit decision level is generated at a time point $t_{12}$ and the fourth bit decision level is generated at a time point $t_{13}$ to be applied to the amplifier 41, when observing a coding period between time points $t_1$ and $t_2$. The detailed operation of the weighting resistor circuit will be described later. The output of the comparator 42 is written in by the trigger pulses (4-*i*) applied to the terminal 431, into the memory circuit 43 whose output is shown in (4-*v*). The memory circuit 441 is controlled by the pulses (4-*q*) applied to a terminal 4415, the pulses (4-*r*) applied to a terminal 4416 and the pulses (4-*s*) applied to a terminal 4417. The flip-flops 4411 and 4412 are reset by pulses (4-*s*) at time points $t_1$, $t_2$ . . . where the coding periods start, and the memory circuit 33 is set simultaneously. Referring to the coding period starting at the time point $t_1$ the flip-flop 4411 is set at the time point $t_{12}$ by a pulse (4-*q*), the state of the memory circuit 441 changes into 10 (The true output of the flip-flops 4411 and 4412 are 1 and 0 respectively.), the matrix circuit 442 generates an output code of 010 and the weighting resistor circuit 452 generates the third bit decision level −2/30. The third bit information (4-*v*) which has been written into the memory circuit 43 just before the time point $t_{13}$ by the trigger pulse (4-*l*) is fed back to the memory circuit 441 and applied to the AND a 4413. Pulses (4-*r*) are applied to and read by the AND gate 4413. In this case, the flip-flop 4411 is not reset because feedback signal (4-*v*) is at 0 state. The pulses (4-*r*) set the flip-flop 4412 to change the condition, output code of the memory circuit 441 being 100 and the output of the weighting resistor circuit 452 being −4/30 which is the decision level of the fourth bit.

In addition to the circuits mentioned above, this coder has circuits to obtain serial PCM signals. As has been mentioned, the first bit information is obtained as the output of the memory circuit 23, the second bit information is obtained as the output of the memory circuit 33, and the third and fourth bit information is obtained as the output of the memory circuit 43. Those output signals are combined by AND gates 51 to 53, and an OR gate 54, under the control of pulses (4-*m*), (4-*n*) and (4-*p*) supplied to terminals 511, 521 and 531 respectively. The outputs of the memory circuits 23, 33 and 43 are gated by the pulses (4-*m*), (4-*n*) and (4-*p*), respectively, whereby the serial PCM signals (4-*w*) are obtained as the outputs of the OR gate 54.

Figure 6:
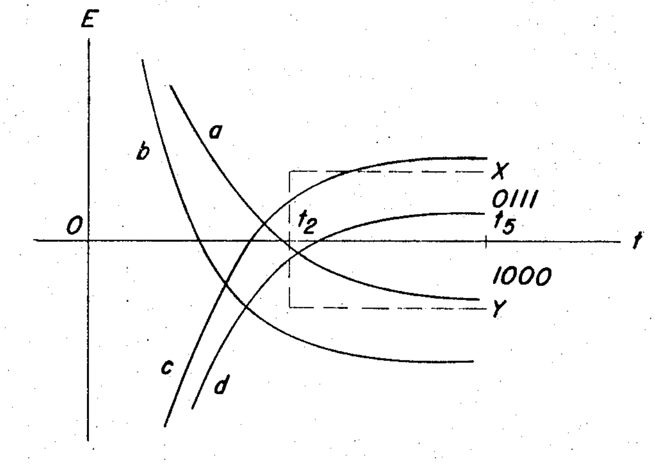
FIG. 6 is a group of characteristic curves showing time variation of an input signal to comparator 32 of the second bit coding circuit in FIG. 1.

Difficulties which arise at the high speed coding operation is now explained referring to FIG. 6, wherein the ordinate shows input voltage E to the second bit comparator 32 and the abscissa shows the lapse of time, with $t_2$ showing the time point where the second bit is judged and $t_5$ showing the time point where the fifth bit is judged. The second bit decision level of the comparator 32 is 0 volt. As the folded binary code is used in the coder wherein code 1 arises frequently when the absolute value of input signal is smaller, the coded output at the second, third, fourth and fifth bits must be 0111 in response to the input signal which are included in the predetermined region between the second bit decision level (zero level in this case) and the dashed line X shown in FIG. 6. Similarly, the coded output must be 1000 in response to the input signal which are included in the predetermined region between the second bit decision level (zero level) and the dashed line Y of FIG. 6. Although the second bit coded output at time point $t_2$ is right for such input signals which vary as shown by curves *a*, *b* and *c* of FIG. 6, such an input signal which varies as shown by curve *d* is miscoded into 1000 though it must be coded as 0111 as is clearly shown by the figure. This is because the second bit is mis-determined at the second bit decision time $t_2$ as the input signal has not converged enough, which in turn causes misjudging of the third, fourth an fifth bits. This phenomenon comes from lack of time margin as the original bandwidth of the amplifier 31 is not enough, because the frequency response of said amplifier circuit decreases for such signals as the output of said amplifier 31 converges to 0V because of high impedances shown by the diodes 315 and 316.

On the other hand, since the output code signal of the first bit coding circuit does not affect the judgements of the second and the succeeding bits, the full coding period can be utilized for the first bit coding operation. Also, even when the input analogue signal stands near zero level and the pulse response of the first bit coding circuit is comparatively slow due to the diodes 216 and 217, the second bit and the succeeding bits of comparatively larger weight are determined to 1 regardless of the polarity of the input analog signal, and the analog output signal of the first bit coding circuit reaches the correct level with a sufficient time margin until when the output analog signal is used for determining the codes of the comparatively smaller weight. By the foregoing reason, the first bit coding circuit is hardly driven into misoperation. This means that only the second bit coding circuit is a bottleneck for the speeding-up of the coding operation.

When the input signal shown by curve *d* in FIG. 6 is applied to the second bit comparator 32, this input signal is mis-encoded to be 1 as the second bit coding output signal, as has been mentioned above, because convergence of the input signal is not enough at the second bit decision time point $t_2$. At the fifth bit decision time point $t_5$, however, correct proper decision of 0 is obtained as enough convergence is attained at that time point. For the third to fifth bits, on the other hand, though they may be determined to be 000 as the second bit is determined to be 1 at the time point $t_2$, correction to 111 is needed if the second bit is corrected to be 0 at the time point $t_5$. For such an input signal as curve *c* in FIG. 6 the third, fourth and fifth bits as well as the second bit are determined correctly at the time point $t_2$. Conversely, if the second bit is corrected from 0 to 1, the third, fourth and fifth bits should be corrected from 111 to 000, correspondingly.

Figure 7:
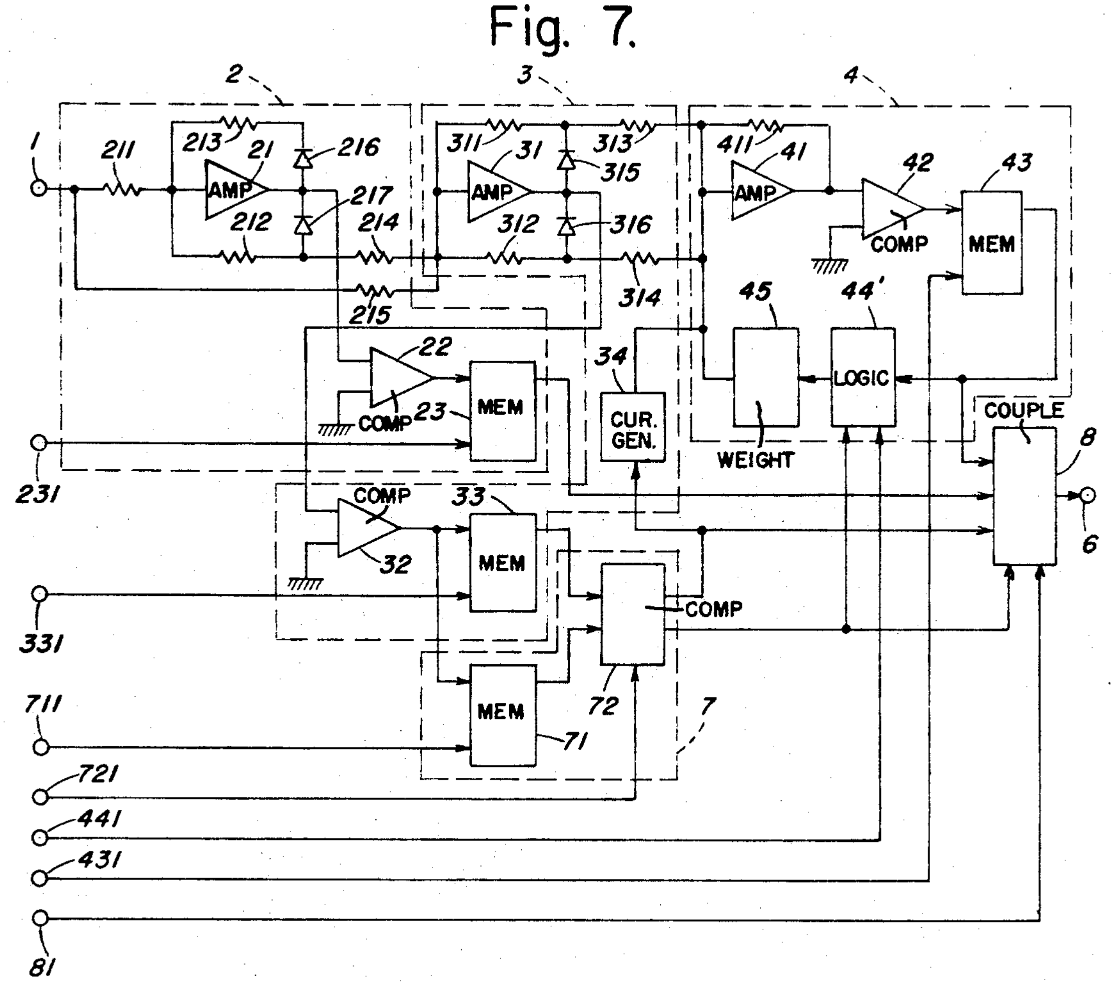
FIG. 7 is a block diagram of the coding apparatus of the invention.

FIG. 7 shows an embodiment of the invention, wherein the input terminal 1, the first bit coding circuit 2 and the second bit coding circuit 3 are the same as those illustrated in FIG. 1. In a control circuit 7, the output of the second bit comparator 32 is written into a memory circuit 71 in response to a control signal applied to a terminal 711 at the decision time point of the fifth bit, and its output signal is compared in a comparator 72 with the output signal of the second bit memory circuit 33 under the control of a control signal provided through a terminal 721. One of the outputs of the comparator circuit 72 controls the current generator circuit 34 in the second bit coding circuit. To this output of the comparator 72, the output signal of the second bit memory circuit 33 is led out during the time interval between the second bit decision time point and fifth bit decision time point, and the output signal of the memory circuit 71 is led out after the fifth bit decision time point. Another output of the comparator circuit 72 is used to correct the memory contents in the memory circuit corresponding to the third to fifth bits included in a logic circuit 44' of the feedback type coding circuit 4 from 111 to 000 or from 000 to 111, when the outputs of two memory circuits 33 and 71 do not coincide with each other. A coupling circuit 8 suitably couples the output signals of the first bit coding circuit 2, the second bit coding circuit 3, the feedback type coding circuit 4 and the control circuit 7 under control of the control signals supplied through a terminal 81. The coded output signal thus generated is then provided to the output terminal 6.

Figure 8:
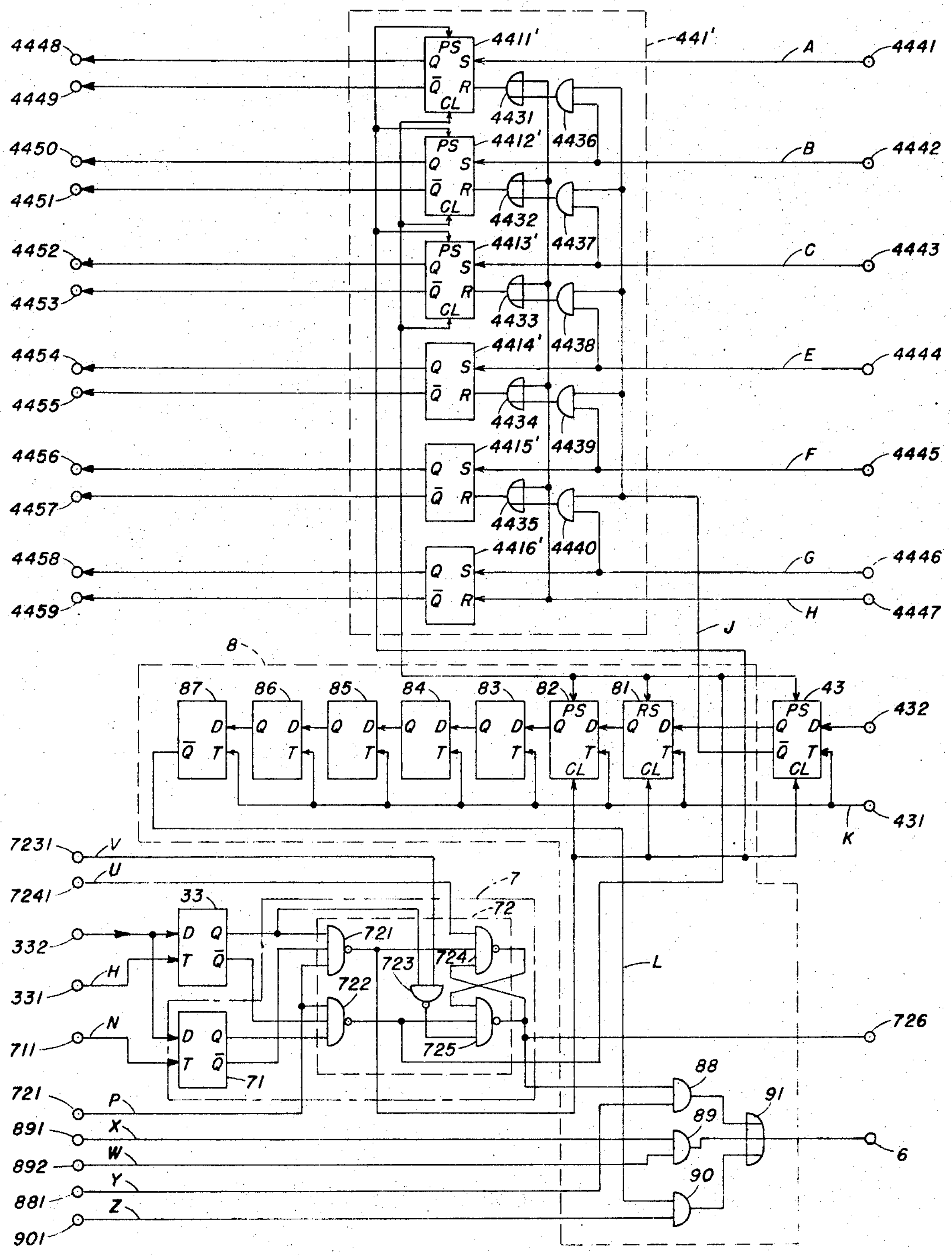
FIG. 8 is a detailed circuit diagram of a part of the circuit in FIG. 7.
Figure 9:
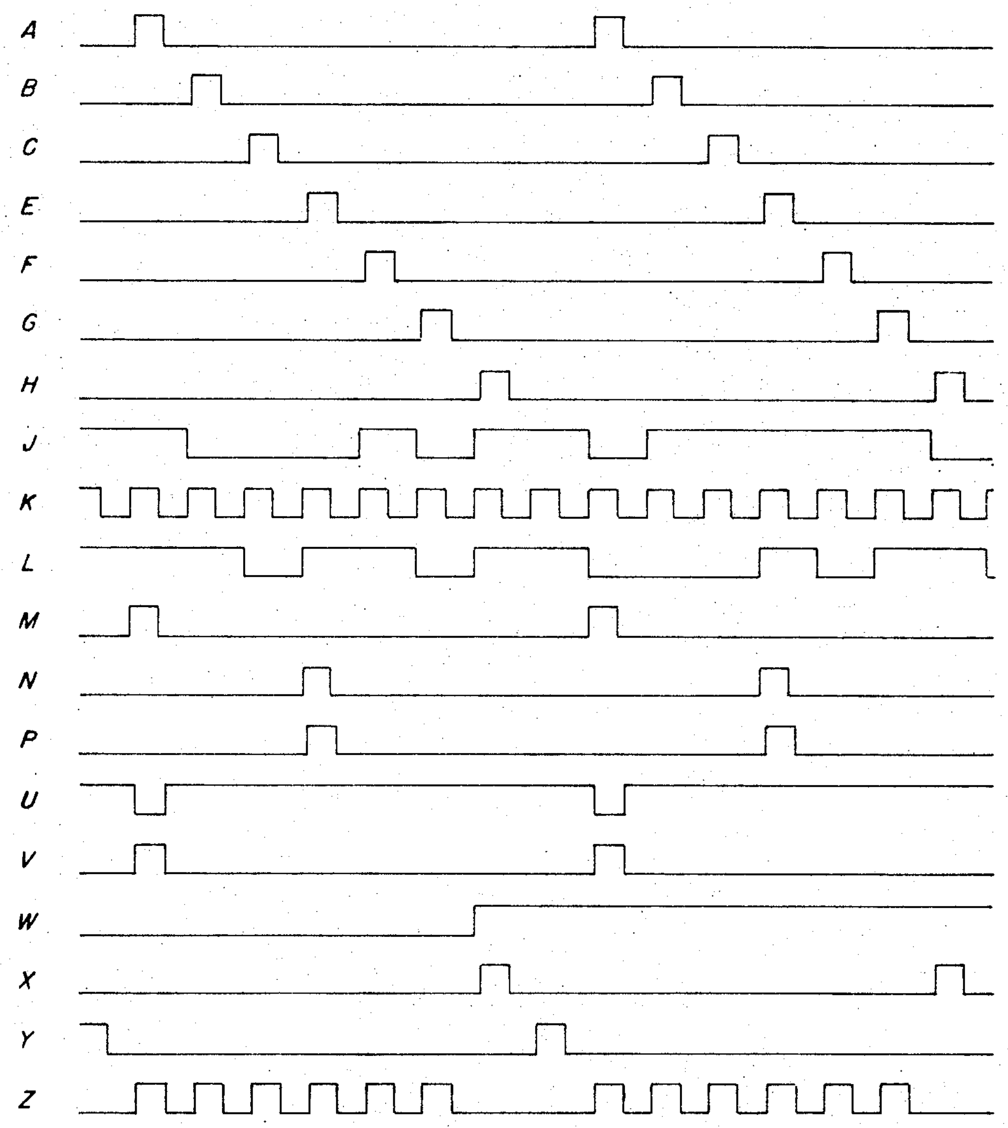
FIG. 9 shows waveforms effective in FIG. 8.

FIG. 8 shows detailed circuit diagrams of the control circuit, the coupling circuit and the memory circuit of the feedback type coding circuit shown in FIG. 7, in case of 8-bit encoding. FIGS. 9A through 9Z (which are referred to by 9-A to 9-Z for simplicity) show waveforms in the circuits of FIG. 8. The corresponding alphabetical characters are indicated in the circuits of FIG. 8. The logic circuit 44' (FIG. 7) of the feedback type coding circuit is comprised of a memory circuit 441' and a matrix circuit (not shown in FIG. 8), and the memory circuit 441' is comprised of flip-flops 4411' to 4416', OR gates 4431 to 4435 and AND gates 4436 to 4440. The output of the memory circuit 43 (9-J) and control pulses supplied to terminals 4441 to 4447 (9-A to H) control the memory circuit 441'. The output signal of the memory circuit 441' drives the matrix circuit through terminals 4448 to 4459. The memory circuit 33 of the second bit coding circuit 3 and the memory circuit 71 of the control circuit 7 are composed of D-type flip-flops, respectively, and the output of the comparator 32 is written into the respective flip-flops by writing pulses supplied to terminals 331 and 711 (9-H, N). The comparator 72 comprised of NAND gates 721 to 725 compares output signals of the memory circuits 33 and 71 under the control of the timing pulses applied through the terminal 721 (9-P), and if the outputs of the memory circuits are 1 and 0, the comparator 72 sets the flip-flops 4411' to 4413' and resets memory circuits 81 and 82 in the coupling circuit 8 and the memory circuit 43. If the outputs of the memory circuit 33 and 71 are 0 and 1 on the contrary, the comparator 72 resets the flip-flops 4411' to 4413' and sets the memory circuits 43, 81 and 82. The output of the gate 725 of the comparator circuit 72 on the other hand drives current generator circuit 34 through a terminal 726. The coupling circuit 8 is comprised of flip-flops 81 to 87, AND gates 88 to 90 and an OR gate 91. The output signal of the first bit memory circuit of FIG. 7 is supplied to a terminal 892 (9-W), and reading is effected by reading pulse supplied to a terminal 891 (9-X). Reading pulses supplied to a terminal 881 (9-Y) is for the second bit and reading pulses supplied to a terminal 901 (9-Z) is for the third to eighth bits (9-L). Output signals out of these gates 88 to 90 are combined by the OR gate 91 forming serial PCM signal to be supplied to the terminal 6. Flip-flops 81 to 87 form a shift register for the third to eighth bit to memorize necessary information and to delay the information by a necessary time interval for coupling the first bit with the succeeding bits. The shift register also acts as a memory circuit to correct the third to fifth bits.

In summary, this invention provides a coder which carries out non-linear coding of speech signals of about 100 channels in time division multiplexing fashion by addition of some digital circuits to the conventional coder for 24 channels or so. In other words, this invention makes it possible to carry out a high speed coding without using specially high speed operational amplifiers.

What is claimed is:

1. A coder for converting an input analog signal into a digital output signal having first, second and other bit signals in sequence, comprising:

an input terminal for receiving said input analog signal;

a first coding circuit activated by said input analog signal derived from said input terminal for generating said first bit signal and thereafter writing said generated first bit signal in a first memory, said first bit signal indicating the polarity of said input analog signal, the output signal of said first coding circuit being a rectified signal of said input analog signal;

a second coding circuit activated by said rectified signal for generating said second bit signal judged at a first time point by comparing said rectified signal with a predetermined second bit decision level and thereafter writing said generated second bit signal in a second memory, a third feedback coding circuit activated by said second bit signal and an output analog signal derived from said second coding circuit for generating said other bit signals by comparing said output analog signal with other predetermined bit decision levels derived from a local decoder included in the feedback loop of said third feedback coding circuit and writing said generated other bit signals in a third memory; said second and other bit signals subject to error due to the level difference between said rectified signal and said second bit decision level at said first time point;

a control circuit coupled to said second memory including a fourth memory for memorizing the second bit signal subsequently judged at a second time point where said second bit signal is not subjected to error due to said level difference, said second time point succeeding said first time point, and a comparator for comparing said generated second bit signal at said first time point with said secondarily judged second bit signal at said second time point to generate control signals for correcting the errors of said second and other bit signals when said generated second bit signals differ from said subsequently judged second signal; and a combining circuit for combining said first bit signal and the corrected second and other bit signals to constitute said digital output signal.

2. The signal coder according to claim 1 in which said second coding circuit produces an erroneous 1 bit at said first time point; said second memory stores said last-mentioned 1 bit; said third feedback coding circuit responsive to said erroneous 1 second bit produces erroneous 000 bits as said erroneous other bit signals; said third memory storing said last-mentioned other bit signals; and said control circuit responsive to said erroneous 1 bit at said first time point and said secondarily judged second bit comprising a 0 bit at said second time point for producing an output signal to be read out as another second 0 bit in replacement of said erroneous second 1 bit and to activate said third memory to provide 111 bits as said other bit signals in replacement of said erroneous other bit signals 000.

3. The signal coder according to claim 1 in which said second coding circuit produces an erroneous 0 bit at said first time point; said second memory stores said last-mentioned 0 bit; said third feedback coding circuit responsive to said erroneous 0 second bit produces erroneous 111 bits as said erroneous other bit signals; said third memory storing said last-mentioned other bit signals; and said control circuit responsive to said erroneous 0 bit at said first time point and said secondarily judged second bit comprising a 1 bit at said second time point for producing an output signal to be read out as another second 1 bit in replacement of said erroneous 0 second bit and to activate said third memory to provide 000 bits as said other bit signals in replacement of said erroneous other bit signals 111.

* * * * *